United States Patent [19]

Uchida

[11] Patent Number: 5,793,098
[45] Date of Patent: Aug. 11, 1998

[54] PACKAGE INCLUDING CONDUCTIVE LAYERS HAVING NOTCHES FORMED

[75] Inventor: Hiroyuki Uchida, Tokyo, Japan

[73] Assignee: NEC Corporation, Tokyo, Japan

[21] Appl. No.: 755,014

[22] Filed: Nov. 22, 1996

[30] Foreign Application Priority Data

Nov. 25, 1995 [JP] Japan ................... 7-329816

[51] Int. Cl.⁶ .................. H01L 23/58; H01L 23/62
[52] U.S. Cl. ............. 257/665; 257/692; 257/774; 257/775; 257/923; 257/728; 361/774; 361/777
[58] Field of Search ................. 257/665, 691, 257/692, 700, 739, 774, 775, 923, 924, 728; 361/774, 775, 777

[56] References Cited

U.S. PATENT DOCUMENTS

| | | | |
|---|---|---|---|
| 3,715,635 | 2/1973 | Michel et al. | 257/775 |
| 4,322,778 | 3/1982 | Barbour et al. | 257/700 |
| 4,714,952 | 12/1987 | Takekawa et al. | 257/700 |
| 5,157,477 | 10/1992 | Chance | 257/700 |
| 5,185,651 | 2/1993 | Boezen | 257/923 |
| 5,264,729 | 11/1993 | Rostoker et al. | 257/700 |
| 5,289,036 | 2/1994 | Nishimato | 257/775 |
| 5,329,162 | 7/1994 | Nadaoka | 257/775 |
| 5,331,204 | 7/1994 | Kuroda et al. | 257/700 |
| 5,402,318 | 3/1995 | Otsuka et al. | 257/700 |
| 5,461,260 | 10/1995 | Varker et al. | 257/775 |
| 5,528,083 | 6/1996 | Malladi et al. | 257/924 |

FOREIGN PATENT DOCUMENTS

| | | | |
|---|---|---|---|
| 63-66950 | 3/1988 | Japan | 257/775 |
| 63-232447 | 9/1988 | Japan | 257/775 |

Primary Examiner—David Ostrowski
Attorney, Agent, or Firm—Young & Thompson

[57] ABSTRACT

In a package including a substrate, a conductive layer formed within the substrate, an internal lead element connected via a first throughhole to the conductive layer, and an external lead element connected via a second throughhole to the conductive layer, notches are formed in the conductive layer in close proximity to the first and second throughholes.

15 Claims, 9 Drawing Sheets

PACKAGE INCLUDING CONDUCTIVE LAYERS HAVING NOTCHES FORMED

BACKGROUND OF THE INVENTION

1. Field of the Invention

The present invention relates to a package for semiconductor devices such as a pin grid array (PGA) package, and more particularly, to the improvement of metallized layers, i.e., conductive layers.

2. Description of the Related Art

In a prior art PGA package, a power supply metallized layer and a ground metallized layer are provided within a laminated substrate. A plurality of power supply pins are connected via throughholes to the power supply metallized layer. Also, a plurality of ground pins are connected via throughholes to the ground metallized layer. Further, a semiconductor chip is mounted on the ground metallized layer and is electrically connected by bonding wires to bonding leads provided on the substrate. The bonding leads are connected to pins including the power supply pins and the ground pins. In this case, connections between leads and the power supply pins or the ground pins are carried out via throughholes.

Thus, a connection layer layout can be easily made by connecting the power supply pins, the ground pins and the bonding leads to the power supply metallized layer and the ground metallized layer. Also, the electrical properties of the power supply metallized layer and the ground metallized layer can be improved, in particular, the inductance of the power supply metallized layer and the ground metallized layer is small, so that noise can be reduced.

However, recently, the operating speed of such packages has been remarkably increased. As a result, even when the inductance of the power supply metallized layer and the ground metallized layer is small, a large impedance is generated in terms of alternating currents.

SUMMARY OF THE INVENTION

It is an object of the present invention to reduce an inductance of metallized layers in a package for high speed semiconductor devices.

According to the present invention, in a package including a laminated substrate, a conductive layer formed within the substrate, an internal lead element connected via a first throughhole to the conductive layer, and an external lead element connected via a second throughhole to the conductive layer, notches are formed in the conductive layer in close proximity to the first and second throughholes. Thus, a current path between the first and second throughholes is substantially reduced, which can reduce the inductance of the conductive layer.

BRIEF DESCRIPTION OF THE DRAWINGS

The present invention will be more clearly understood from the description as set forth below, as compared with the prior art, with reference to the accompanying drawings, wherein.

DESCRIPTION OF THE PREFERRED EMBODIMENTS

Before the description of the preferred embodiments, a prior art PGA package will be explained with reference to FIGS. 1 and 2.

Figure 1:
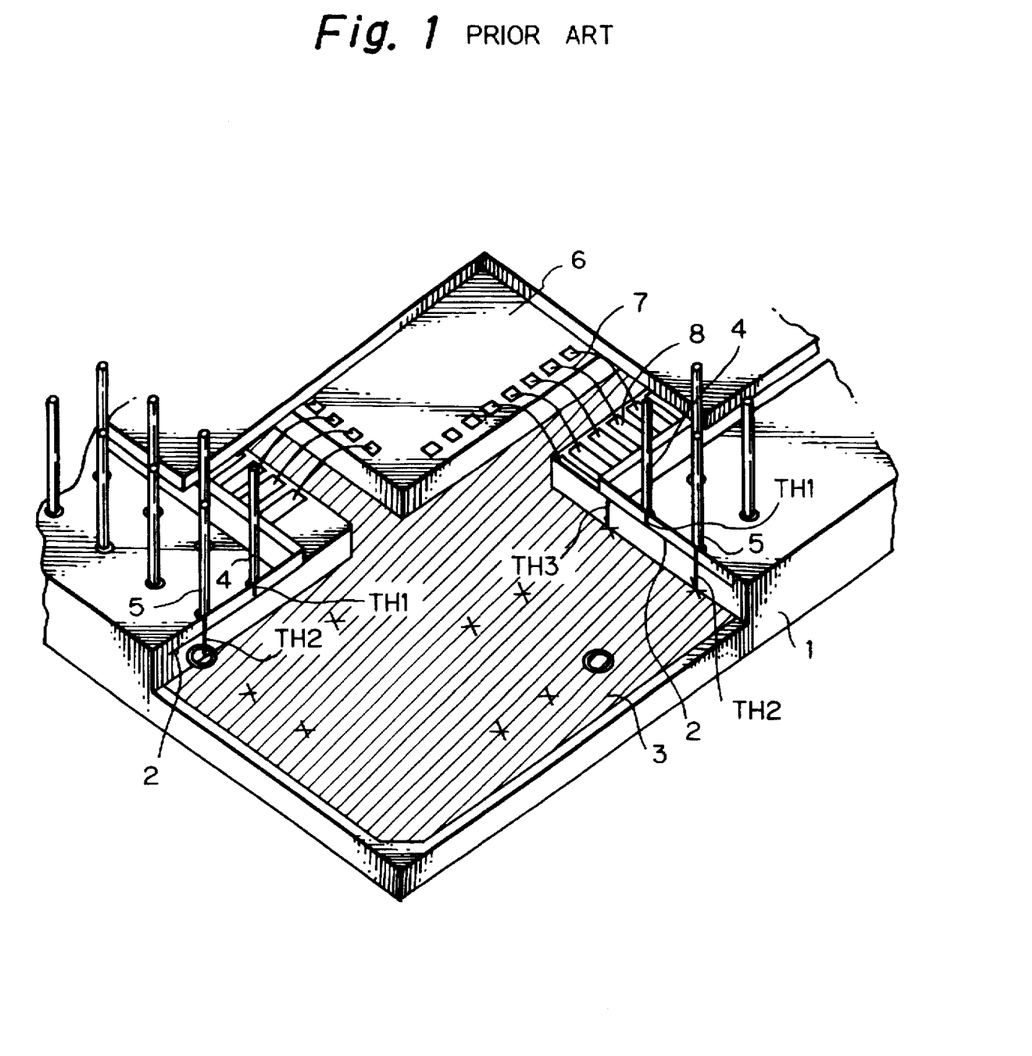
FIG. 1 is a partly-cut perspective view illustrating a prior art package.
Figure 2:
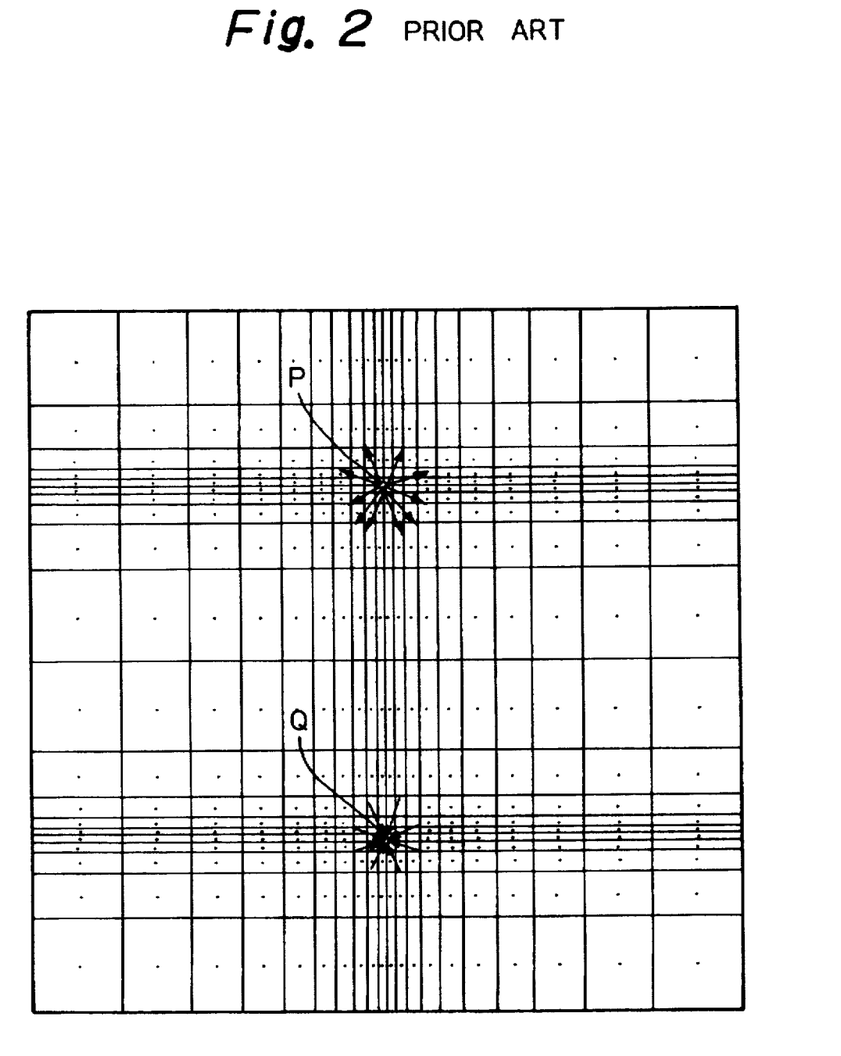
FIG. 2 is a diagram showing a current distribution of the package of FIG. 1.

In FIG. 1, reference numeral 1 designates a laminated substrate made of ceramic or plastic such as glass epoxy resin. A power supply metallized layer 2 and a ground metallized layer 3 are provided within the laminated substrate 1.

A plurality of power supply pins 4 are connected via throughholes TH1 to the power supply metallized layer 2. Also, a plurality of ground pins 5 are connected via throughholes TH2 to the ground metallized layer 3 as indicated by X.

Further, a semiconductor chip 6 is mounted on the ground metallized layer 3. The semiconductor chip 6 is electrically connected by bonding wires 6 to bonding leads 8 provided on the substrate 1.

The bonding leads 8 are connected to pins 5 including the power supply pins 4 and the ground pins 5. In this case, connections between the bonding leads 8 and the power supply pins 4 (or the ground pins 5) are carried out via throughholes TH3 or the like.

Thus, a connection layer layout can be easily made by connecting the power supply pins 4, the ground pins 5 and the bonding leads 8 to the power supply metallized layer 2 and the ground metallized layer 3. Also, the electrical property of the power supply metallized layer 2 and the ground metallized layer 3 can be improved, in particular, the inductance of the power supply metallized layer 2 and the ground metallized layer 3 is small, so that noise can be reduced.

However, recently, the operating speed of such packages has been remarkably increased. As a result, even when the inductance of the power supply metallized layer 2 and the ground metallized layer 3 is small, a large impedance is generated in terms of alternating currents. For example, as shown in FIG. 2, if a high potential throughhole P and a low potential throughhole Q are located on the ground metallized layer 3, currents flowing out of the high potential throughhole P are almost isotropic, and also, currents flowing into the low potential throughhole Q are almost isotropic. As a result, a current path between the high potential throughhole P and the low potential throughhole Q becomes substantially long, and therefore, the inductance cannot be reduced. Thus, a large inductance is generated in the high speed packages.

Figure 3:
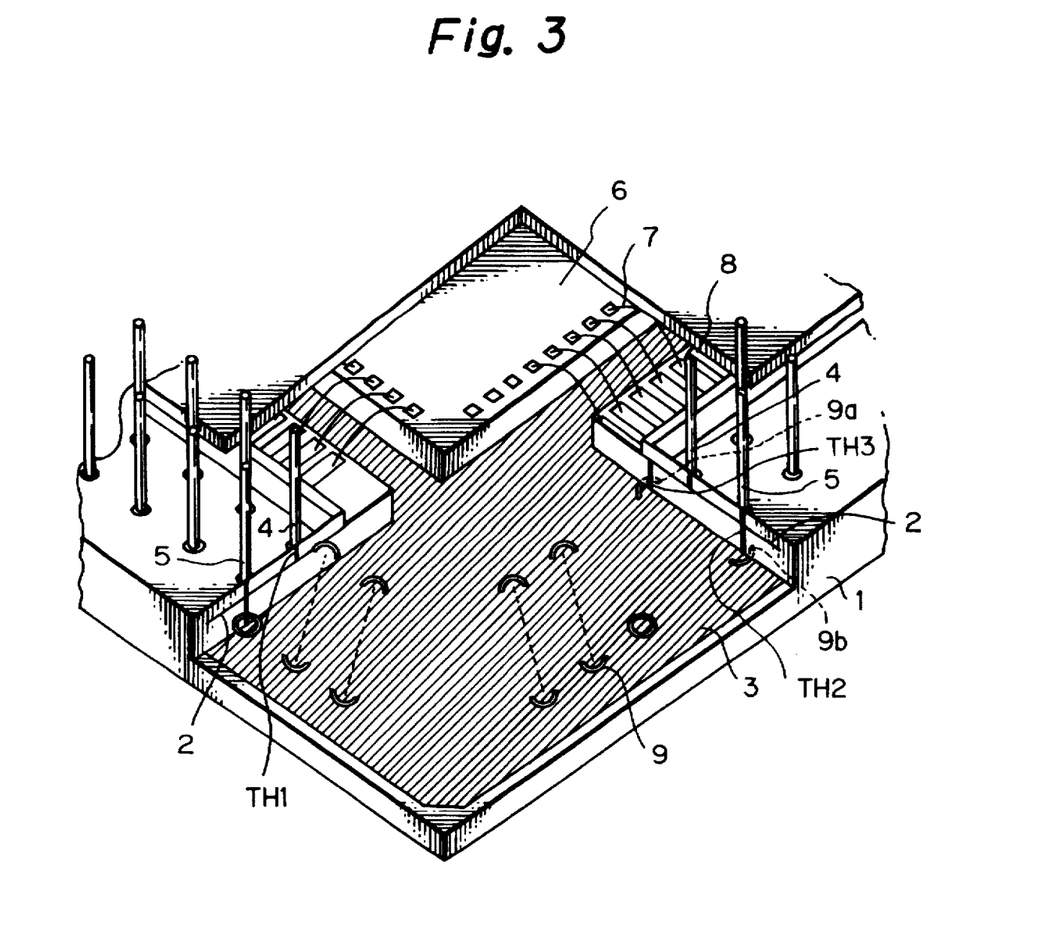
FIG. 3 is a partly-cut perspective view illustrating a first embodiment of the package according to the present invention.

In FIG. 3, which illustrates a first embodiment of the present invention, notches 9 are provided in close proximity to the throughholes TH2 and TH3 in the ground metallized layer 3. In this case, the notches 9 are located outside of the path of currents. For example, a notch 9a is provided outside of the throughhole TH3 on the side of the bonding leads 8 opposite to the ground pin 5. Also, a notch 9b is provided outside of the throughhole TH2 opposite to the throughhole TH3.

Figure 4:
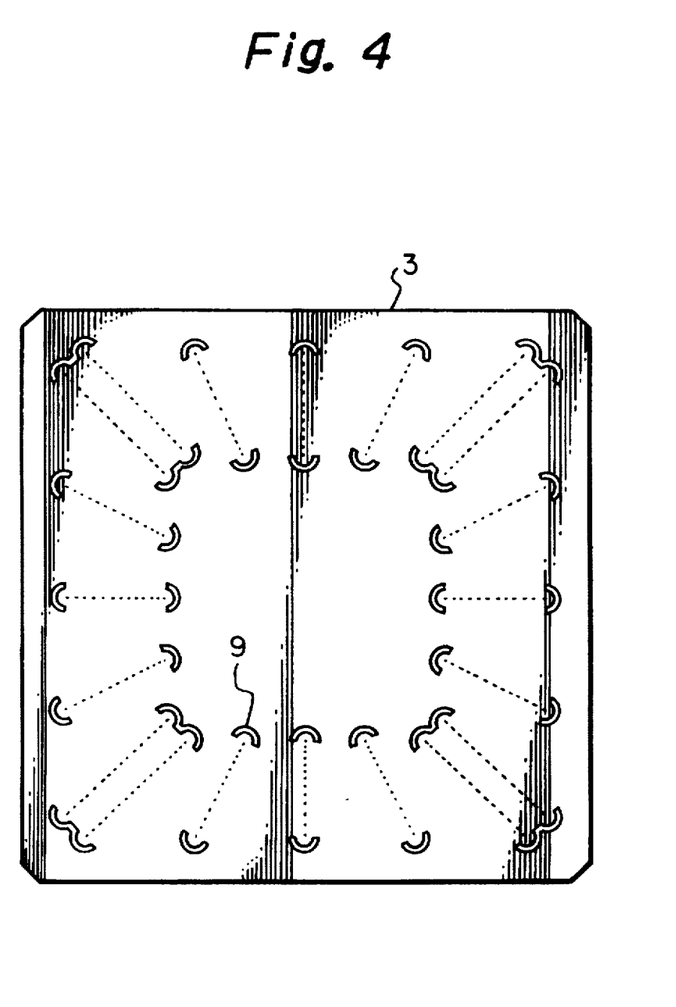
FIG. 4 is a plan view of the ground metallized layer of FIG. 3.

In FIG. 4, which is a plan view of the ground metallized layer 3, each pair of the notches 9 face each other, so that a current path between each pair of throughholes on the ground metallized layer 3 can be substantially reduced.

If the substrate 1 is made of ceramic, the notches 9 can be patterned by using a thick film printing method. Also, if the substrate 1 is made of glass epoxy resin, the notches 9 can be patterned by an etching method.

Generally, an inductance L of a metallized layer is defined by $$L = \Phi/I$$

where I is a current flowing through the metallized layer; and $\Phi$ is a magnetic flux generated by the current I.

Figure 5A:
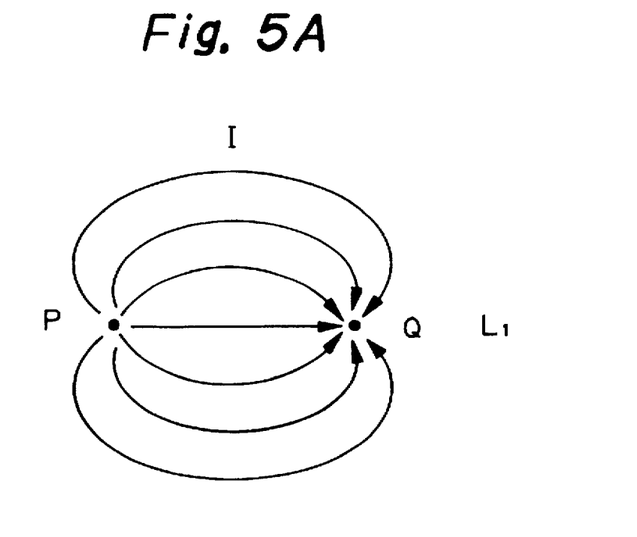
FIGS. 5A, 5B and 5C are diagrams for explaining inductances between a current flow-out point and a current flow-in point.
Figure 5B:
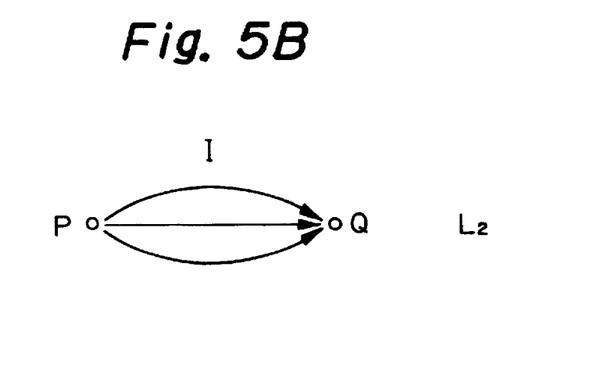
Figure 5C:
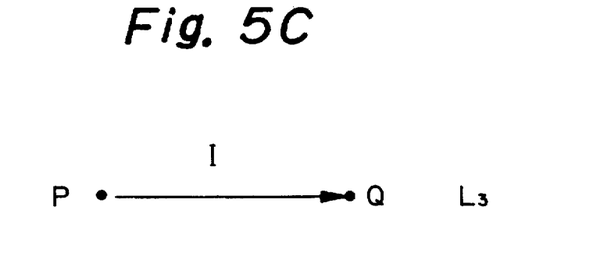

Assume three cases as illustrated in FIGS. 5A, 5B and 5C. In the case of FIG. 5A, the amount of detour currents is the largest. In the case of FIG. 5B, the amount of detour currents is relatively small. In the case of FIG. 5C, the amount of detour currents is the smallest. As a result, if the inductances of the cases of FIGS. 5A, 5B and 5C are denoted by $L_1$, $L_2$ and $L_3$, respectively, $$L_1 > L_2 > L_3$$

Therefore, when the amount of detour currents is reduced, the inductance L can be reduced.

Figure 6:
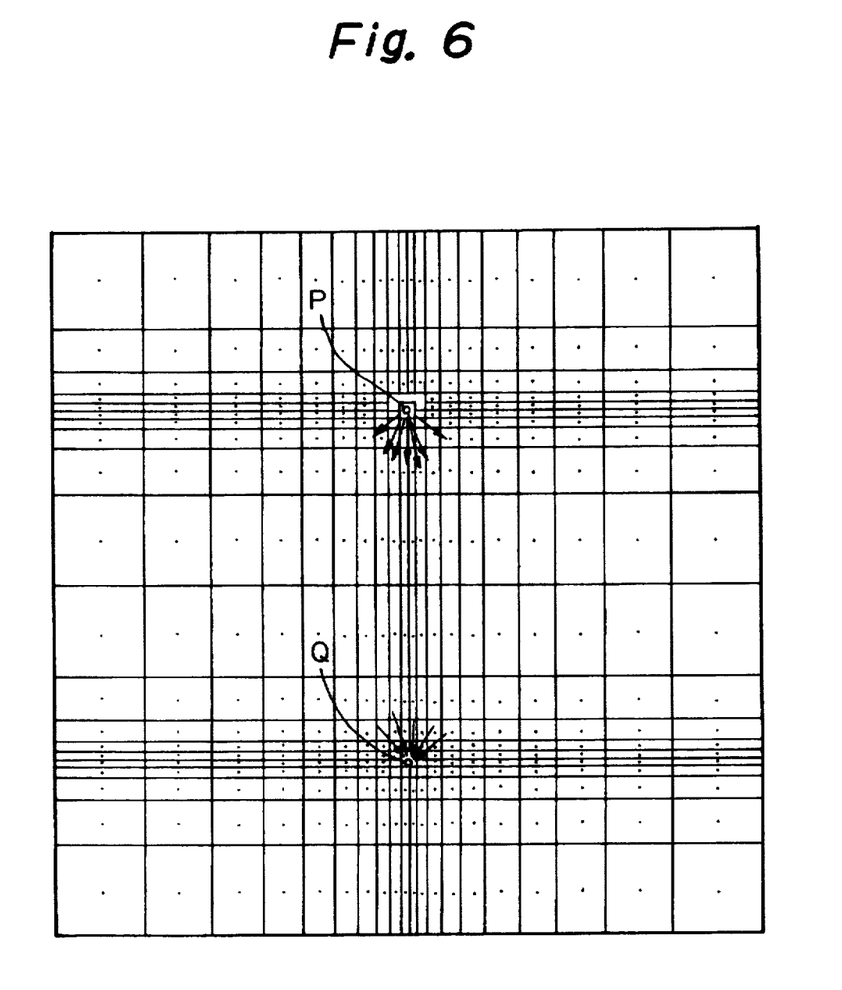
FIG. 6 is a diagram showing a current distribution of the package of FIG. 3.

In the first embodiment as illustrated in FIGS. 3 and 4, detour currents between two throughholes is suppressed by the notches 9. Actually, as illustrated in FIG. 6, which shows a simulation result, currents to the notches are cut, and therefore, detour currents between the high potential throughhole P and the low potential throughholes Q are suppressed. Therefore, a current path is substantial reduced to reduce the inductance. The reduction depending upon the shape of the metallized layer and the spacing between the throughholes is about 25 to 45 percent as compared with the prior art.

Figure 7:
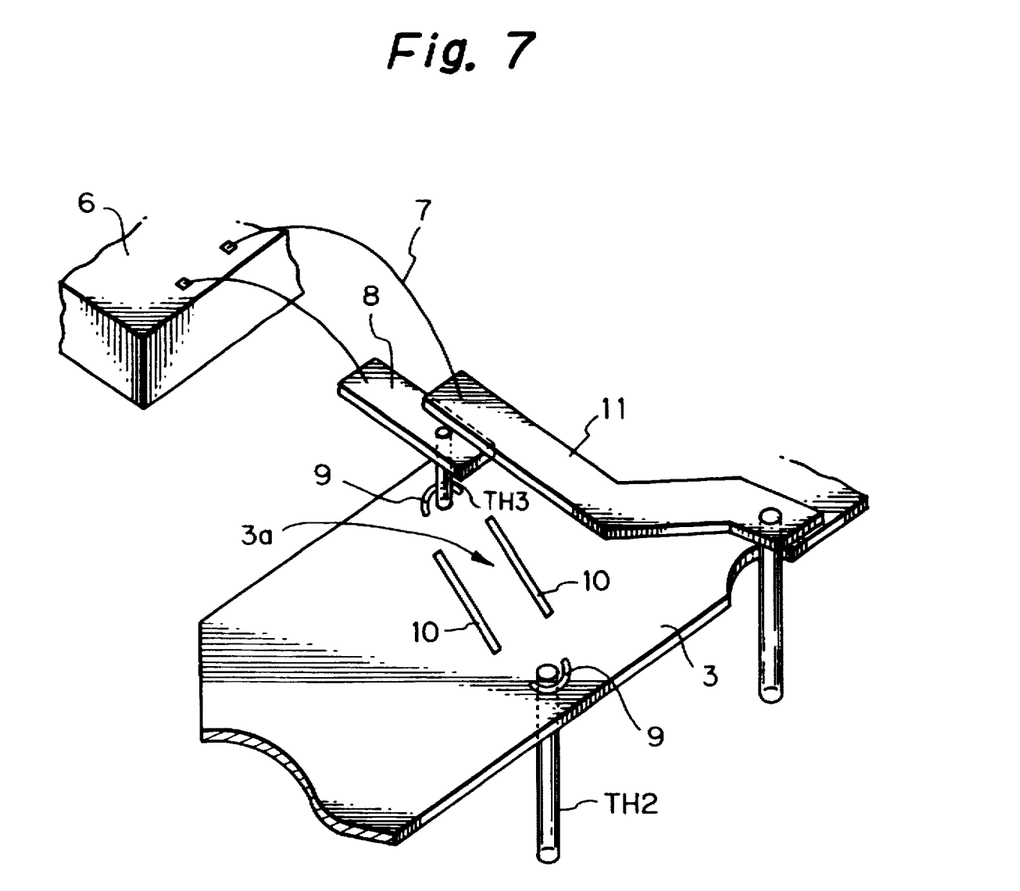
FIG. 7 is a perspective view illustrating a second embodiment of the package according to the present invention.

In FIG. 7, which illustrates a second embodiment of the present invention, notches 10 are added to the ground metallized layer 3 of FIG. 3. In this case, the notches 10 are outside of a part 3a of the ground metallized layer 3 between the throughholes TH2 and TH3. Thus, in the second embodiment, the amount of detour currents is further reduced, as compared with the first embodiment. As a result, the current path between the throughholes TH2 and TH3 is substantially reduced to further reduce the inductance of the ground metallized layer 3.

Also, in FIG. 7, the part 3a of the ground metallized layer 3 opposes a signal layer 11. In this case, when the width of the part 3a of the ground metallized layer 3 is about four times that of the signal layer 11, the inductance of the ground metallized layer 3 can be minimized. This is explained with reference to FIG. 8 which shows inductances for two parallel plate type connections 81 and 82. That is, since a width $W_1$ of the connection 81 is definite, the self inductance $L_1$ of the connection 81 is definite. On the other hand, since the width $W_2$ of the connection 82 is variable, the smaller the self inductance $L_2$ of the connection 82, the larger the width $W_2$. Also, the mutual inductance $M_{12}$ between the connections 81 and 82 is changed in accordance with a smaller one of the self inductances $L_1$ and $L_2$. In this case, if the direction of current flowing through the connection 81 is opposite to that of a current flowing through the connection 82, a total inductance L is represented by $$L = L_1 + L_2 - M_{12}$$

Figure 8:
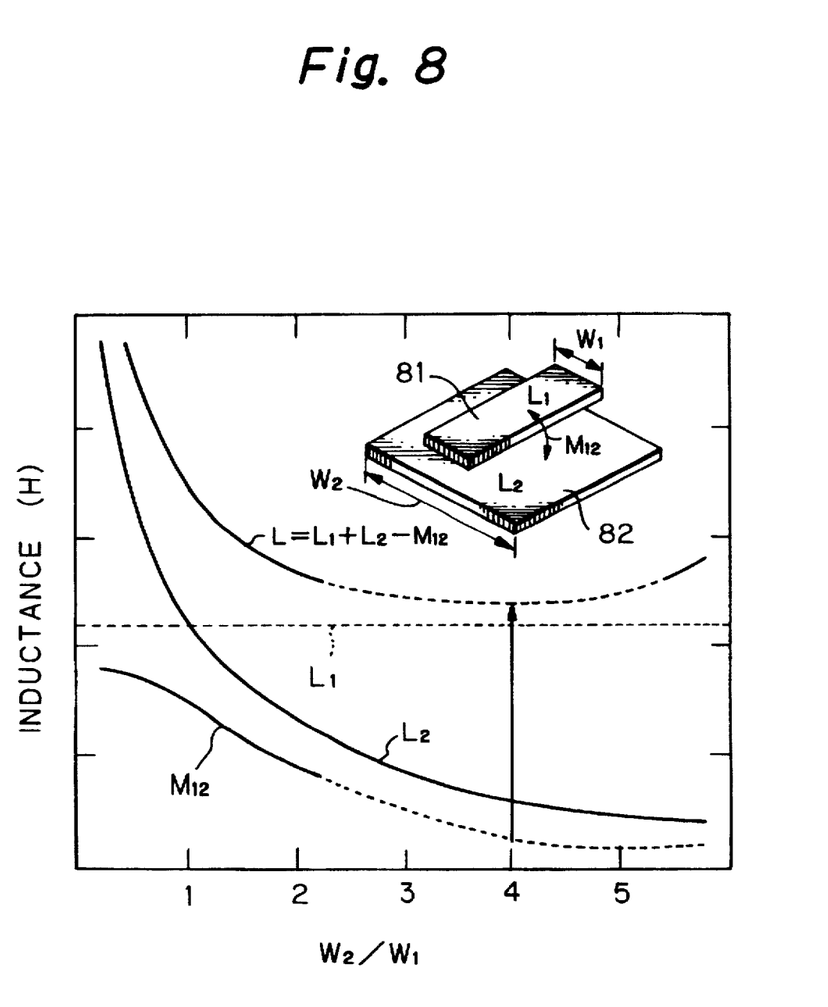
FIG. 8 is a graph showing an inductance between two parallel plate type conductive layers.

When $W_2 = 4W_1$, the total inductance L is minimized. Note that the connections 81 and 82 correspond to the signal layer 11 and the part 3a of the ground metallized layer 3, respectively. Therefore, the current path of the part 3a of the ground metallized layer 3 supplied from the signal layer 11 is limited by the notches 10, and also, the inductance of this current path can be minimized by causing the width of the notches 10 to be about four times that of the signal layer 11.

Figure 9:
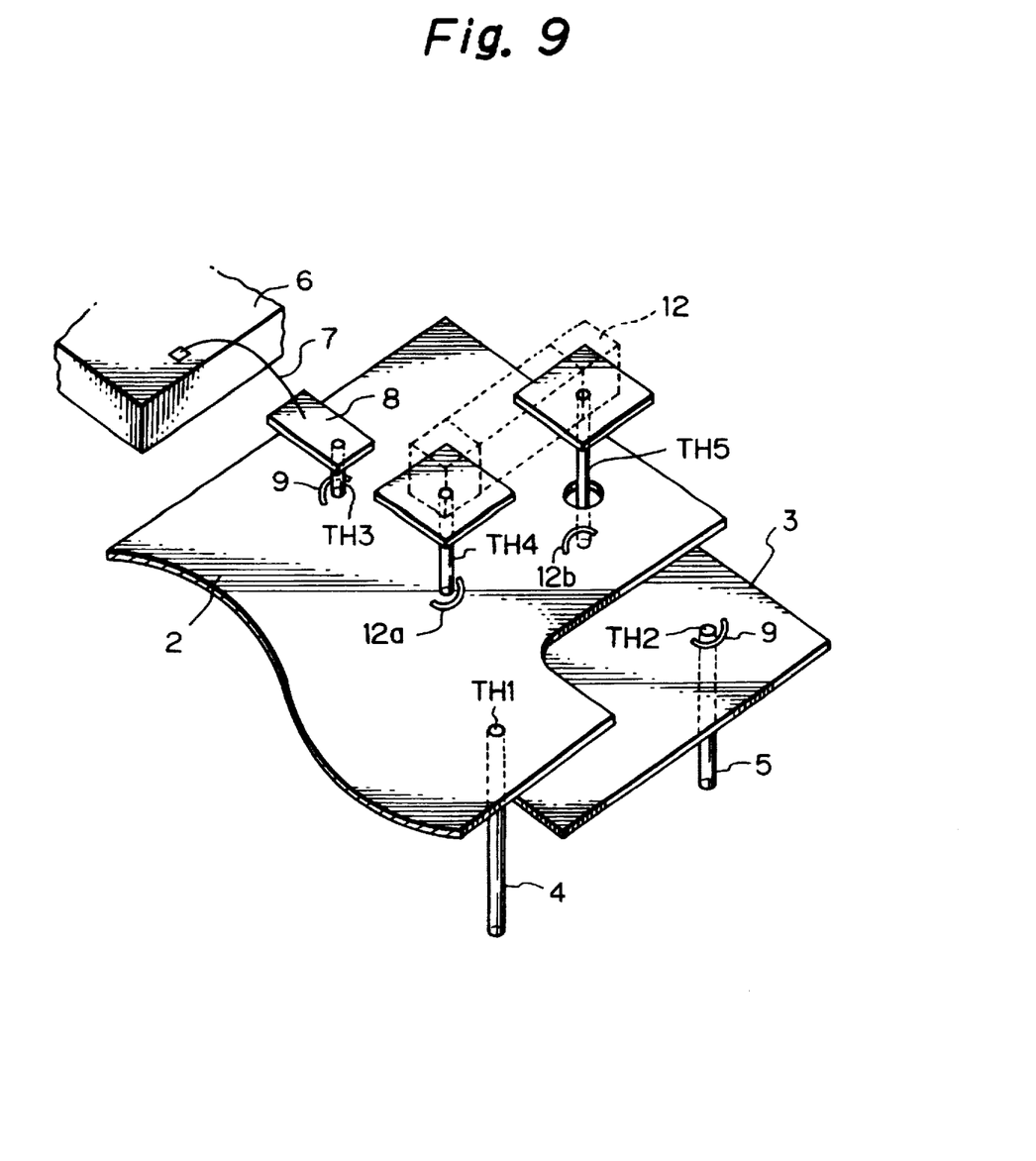
FIG. 9 is a perspective view illustrating a third embodiment of the package according to the present invention.

In FIG. 9, which illustrates a third embodiment of the present invention, a bypass condenser 12 is coupled between the power supply metallized layer 2 and the ground metallized layer 3 of FIG. 3, to remove high frequency noise from the power supply metallized layer 2. That is, one electrode of the bypass condenser 12 is connected via a throughhole TH4 to the power supply metallized layer 2, and a notch 12a is provided in the power supply metallized layer 2 in close proximity to the throughhole TH4. In this case, the notch 9 of the power supply metallized layer 2 and the notch 12a are outside of the throughholes TH3 and TH4. Similarly, the other electrode of the bypass condenser 12 is connected via a throughhole TH5 to the ground metallized layer 3, and a notch 12b is provided in the ground metallized layer 3 in close proximity to the throughhole TH5. In this case, the notch 9 of the ground metallize layer 3 and the notch 12b are outside of the throughholes TH2 and TH5.

Thus, in the third embodiment, the inductance of a noise current path via the bypass condenser 12 can be reduced. That is, the noise component can be passed via the bypass condenser 12 to ground.

Note that the notches provided in the ground metallized layer 3 can be applied to the power supply metallized layer 2.

As explained hereinabove, according to the present invention, since detour currents of metallized layers between throughholes are suppressed to substantially reduce a current path therebetween, the inductance of the metallized layers can be reduced, and therefore, the inductances of metallized layers in high speed semiconductor packages can be also reduced.

I claim:

1. A package comprising:
    a substrate;
    a conductive layer formed within said substrate;
    an internal lead element connected via a first throughhole to said conductive layer; and
    an external lead element connected via a second throughhole to said conductive layer,
    notches being formed in said conductive layer partially surrounding said first and second throughholes and said notches being positioned to suppress detour currents between said first and second throughholes.

2. The package as set forth in claim 1, wherein said notches are located outside of said first and second throughholes.

3. The package as set forth in claim 2, wherein said notches are located outside of a part of said conductive layer between said first and second throughholes.

4. The package as set forth in claim 3, wherein said notches are located along another conductive layer.

5. The package as set forth in claim 4, wherein a spacing between said notches is about four times a width of said other conductive layer.

6. The package of claim 2, wherein said first and second throughholes are at different potentials.

7. The package as set forth in claim 1, further comprising a bypass condenser connected to said conductive layer.

8. The package as set forth in claim 7, wherein a notch is provided in said conductive layer adjacent a connection portion of said bypass condenser and said conductive layer.

9. A package comprising:

a laminated substrate;

first and second conductive layers formed within said laminated substrate;

a first internal lead element connected via a first throughhole to said first conductive layer;

a second internal lead element connected via a second throughhole to said first conductive layer;

a first external lead element connected via a third throughhole to said first conductive layer; and a second external lead element connected via a fourth throughhole to said second conductive layer, a first pair of notches being formed in said first conductive layer partially surrounding said first and third throughholes, respectively and said first pair of notches being positioned to suppress detour currents between said first and third throughholes, a second pair of notches being formed in said second conductive layer partially surrounding said second and fourth throughholes, respectively and said second pair of notches being positioned to suppress detour currents between said second and fourth throughholes.

10. The package as set forth in claim 9, wherein said first pair of notches are located outside of said first and third throughholes, and said second pair of notches are located outside of said second and fourth throughholes.

11. The package as set forth in claim 9, wherein said first pair of notches are located outside of a part of said first conductive layer between said first and third throughholes, and said second pair of notches are located outside of a part of said second conductive layer between said second and fourth throughholes.

12. The package as set forth in claim 11, wherein said first pair of notches are located along a first signal layer, and said second pair of notches are located along a second signal layer.

13. The package as set forth in claim 12, wherein a spacing between said first pair of notches is about four times a width of said first signal layer, and a spacing between said second pair of notches is about four times a width of said second signal layer.

14. The package as set forth in claim 9, further comprising a bypass condenser having a first electrode connected via a fifth throughhole to said first conductive layer and a second electrode connected via a sixth throughhole to said second conductive layer.

15. The package as set forth in claim 14, wherein a notch is provided in said first conductive layer adjacent said fifth throughhole, and a notch is provided in said second conductive layer adjacent said sixth throughhole.

* * * * *